United States Patent
Schumaker et al.

(10) Patent No.: US 10,248,018 B2
(45) Date of Patent: Apr. 2, 2019

(54) IMPRINT APPARATUS AND METHOD OF MANUFACTURING ARTICLE

(71) Applicant: CANON KABUSHIKI KAISHA, Tokyo (JP)

(72) Inventors: Philip D. Schumaker, Austin, TX (US); Xiaoming Lu, Cedar Park, TX (US); Wei Zhang, Austin, TX (US); Atsushi Kimura, Saitama (JP); Jun Ota, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 787 days.

(21) Appl. No.: 14/673,141

(22) Filed: Mar. 30, 2015

(65) Prior Publication Data

US 2016/0288403 A1    Oct. 6, 2016

(51) Int. Cl.
    *G03F 7/00*    (2006.01)
(52) U.S. Cl.
    CPC .................... *G03F 7/0002* (2013.01)
(58) Field of Classification Search
    CPC .............. B29C 43/04; B29C 2043/025; B29C 2043/5833
    See application file for complete search history.

(56) References Cited

U.S. PATENT DOCUMENTS

| | | | | |
|---|---|---|---|---|
| 8,485,624 | B2* | 7/2013 | Mikami | B41J 2/2135 347/14 |
| 2005/0064054 | A1* | 3/2005 | Kasumi | B82Y 10/00 425/112 |
| 2005/0067379 | A1* | 3/2005 | Sreenivasan | B82Y 10/00 216/44 |
| 2006/0175993 | A1* | 8/2006 | Shibata | H02K 41/03 318/135 |
| 2006/0273488 | A1* | 12/2006 | Seki | B82Y 10/00 264/293 |
| 2007/0173098 | A1* | 7/2007 | Kimura | G03F 7/707 439/340 |
| 2009/0091724 | A1* | 4/2009 | Kimura | G03F 7/70758 355/53 |
| 2009/0108483 | A1* | 4/2009 | Suehira | B82Y 10/00 264/40.5 |

(Continued)

FOREIGN PATENT DOCUMENTS

JP    2007299994 A    11/2007

*Primary Examiner* — Jacob T Minskey
*Assistant Examiner* — Baileigh Kate Darnell
(74) *Attorney, Agent, or Firm* — Rossi, Kimms & McDowell LLP (57) ABSTRACT

The present invention provides an imprint apparatus which molds an imprint material on a shot region formed on a substrate by using a mold including a pattern surface on which a pattern is formed, comprising a holding unit configured to change a position and orientation of the mold, and a control unit configured to cause the holding unit to incline the mold, and bring the mold and the imprint material into contact with each other while the mold is inclined, wherein after the control unit obtains a shift amount by which a mark on the mold shifts by inclining the mold, and changes relative positions of the mold and the substrate according to the shift amount, the control unit brings the mold and the imprint material into contact with each other.

14 Claims, 9 Drawing Sheets

(56) References Cited

U.S. PATENT DOCUMENTS

| | | | |
|---|---|---|---|
| 2009/0140445 A1* | 6/2009 | Lu | B29C 43/003 264/40.1 |
| 2009/0148032 A1* | 6/2009 | Schumaker | G06K 9/3216 382/141 |
| 2010/0102487 A1* | 4/2010 | Schumaker | B82Y 10/00 264/408 |
| 2010/0110434 A1* | 5/2010 | Choi | B82Y 10/00 356/401 |
| 2011/0133354 A1* | 6/2011 | Kimura | B82Y 10/00 264/40.5 |
| 2013/0015597 A1* | 1/2013 | Hattori | G03F 7/0002 264/40.1 |
| 2013/0015598 A1* | 1/2013 | Kimura | G03F 7/0002 264/40.1 |

\* cited by examiner

IMPRINT APPARATUS AND METHOD OF MANUFACTURING ARTICLE

BACKGROUND OF THE INVENTION

Field of the Invention

The present invention relates to an imprint apparatus and a method of manufacturing an article.

Description of the Related Art

An imprint apparatus which forms a pattern on an imprint material on a substrate using a mold is attracting attention as one of mass-production lithography apparatuses such as magnetic storage media and semiconductor devices. In the imprint apparatus, the residual film thickness of a pattern formed by an imprint material (the distance between the surface of a substrate and the bottom surface of the concave portion of the pattern formed by the imprint material) is uniformed. Japanese Patent Laid-Open No. 2007-299994 proposes a method in which a mold and an imprint material on a substrate are brought into contact with each other while the mold is inclined so that the surface of the substrate and the pattern surface of the mold, on which a pattern for molding an imprint material is formed, are parallel to each other.

An imprint apparatus brings a mold and an imprint material on a substrate into contact with each other after arranging a shot region below the pattern surface of the mold, and aligns the mold and the substrate while the mold and the imprint material are in contact with each other. While the mold and the imprint material on the substrate are in contact with each other, it is difficult to change the relative positions of the mold and the substrate. Therefore, to quickly perform alignment, the change amounts of the relative positions should be as small as possible in alignment. If, however, the mold is inclined as in the method described in Japanese Patent Laid-Open No. 2007-299994, a mark formed on the mold may shift in a direction perpendicular to a direction in which the mold and the imprint material are brought into contact with each other. That is, if the mold and the imprint material are brought into contact with each other while the mold is inclined, the change amounts of the relative positions of the mold and the substrate in alignment may increase by the inclination amount of the mold.

SUMMARY OF THE INVENTION

The present invention provides, for example, a technique advantageous in quickly aligning a mold and a substrate.

According to one aspect of the present invention, there is provided an imprint apparatus which molds an imprint material on a shot region formed on a substrate by using a mold including a pattern surface on which a pattern is formed, comprising: a holding unit configured to hold the mold and change a position and orientation of the mold; and a control unit configured to cause the holding unit to incline the mold according to an inclination of a surface of the substrate so that the surface of the substrate and the pattern surface are parallel to each other after arranging the shot region below the pattern surface, and bring the mold and the imprint material into contact with each other while the mold is inclined, wherein after the control unit obtains a shift amount by which a mark on the mold shifts, by inclining the mold, in a second direction perpendicular to a first direction in which the mold and the imprint material are brought into contact with each other, and changes relative positions of the mold and the substrate in the second direction according to the shift amount, the control unit brings the mold and the imprint material into contact with each other.

Further features of the present invention will become apparent from the following description of exemplary embodiments with reference to the attached drawings.

DESCRIPTION OF THE EMBODIMENTS

Exemplary embodiments of the present invention will be described below with reference to the accompanying drawings. Note that the same reference numerals denote the same members throughout the drawings, and a repetitive description thereof will not be given.

<First Embodiment>

An imprint apparatus 100 according to the first embodiment of the present invention will be described. The imprint apparatus 100 is used to manufacture a semiconductor device or the like, and performs imprint processing of molding an imprint material 16 on a shot region formed on a substrate 10 by using a mold 6 including a pattern surface 6a on which a pattern is formed. For example, the imprint apparatus 100 cures the imprint material while the mold 6 having the pattern formed on it is in contact with the imprint material 16 on the substrate. The imprint apparatus 100 can widen the spacing between the mold 6 and the substrate 10, and separate (release) the mold 6 from the cured imprint material 16, thereby forming, on the substrate, the pattern formed by the imprint material 16. Examples of a method of curing the imprint material 16 are a heat cycle method using heat and a photo-curing method using light. In the first embodiment, a case in which the photo-curing method is adopted will be explained. The photo-curing method is a method of curing the imprint material 16 by supplying an uncured ultraviolet-curing resin as the imprint material 16 onto the substrate, and irradiating the imprint material 16 with ultraviolet rays while the mold 6 and the imprint material 16 are in contact with each other.

[Arrangement of Imprint Apparatus]

Figure 1:
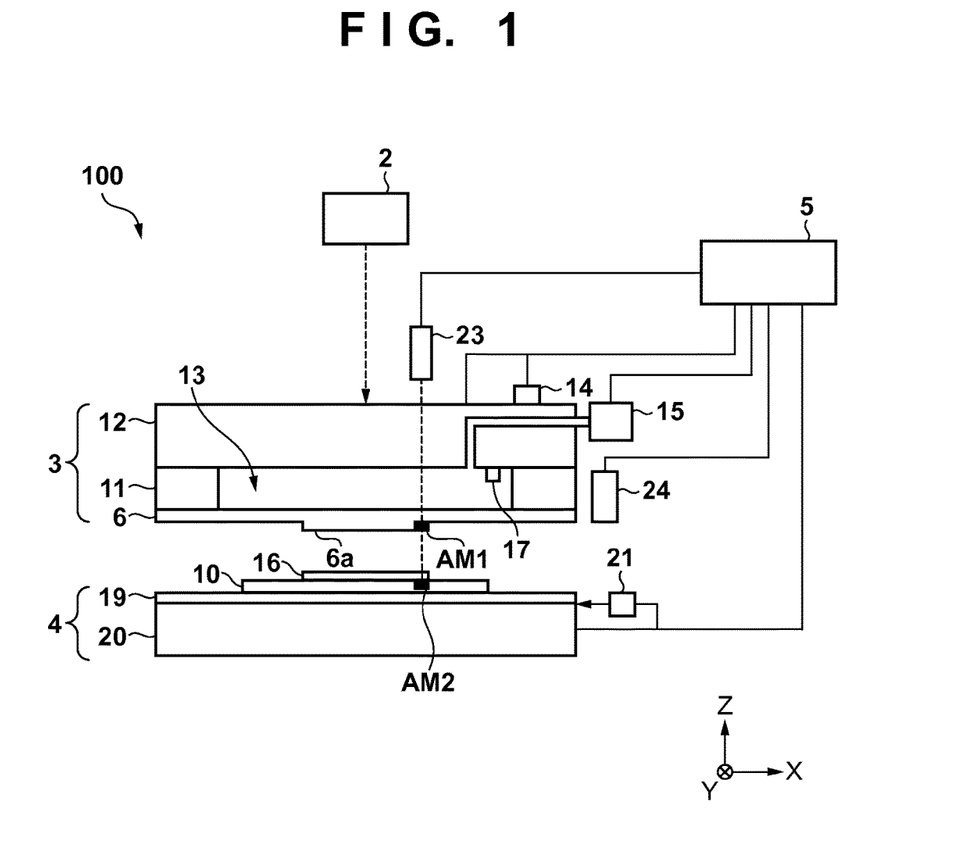
FIG. 1 is a schematic view showing an imprint apparatus according to the first embodiment.

FIG. 1 is a schematic view showing the imprint apparatus 100 according to the first embodiment. The imprint apparatus 100 can include an irradiation unit 2, a mold holding unit 3 (holding unit), a substrate stage 4, a supply unit 24, a detection unit 23, and a control unit 5. The control unit 5 includes, for example, a CPU and a memory, and controls imprint processing (controls each unit of the imprint apparatus 100).

The irradiation unit 2 irradiates the imprint material 16 on the substrate via the mold 6 with light (ultraviolet rays) for curing the imprint material 16 in imprint processing. The irradiation unit 2 can include, for example, a light source and an optical element for adjusting light emitted by the light source to appropriate one for imprint processing. If, for example, the heat cycle method is adopted, a heat source unit for curing a thermosetting resin as the imprint material 16 can be provided in place of the irradiation unit 2.

The mold 6 is generally made of a material such as quartz capable of transmitting ultraviolet rays. A three-dimensional pattern for molding the imprint material on the substrate is formed on part (pattern surface 6a) of the substrate-side surface of the mold 6. As the substrate 10, for example, a single-crystal silicon substrate or SOI (Silicon on Insulator) substrate can be used. The supply unit 24 (to be described later) supplies the imprint material 16 to the upper surface (processed surface) of the substrate 10.

The mold holding unit 3 can include a mold chuck 11 for holding the mold 6 by, for example, a vacuum suction force or an electrostatic force, and a mold driving unit 12 configured to change the position and orientation of the mold 6 held by the mold chuck 11. The mold driving unit 12 can be configured to incline the mold 6 by, for example, driving the mold 6 in the first direction (for example, the Z direction) in which the mold 6 and the imprint material 16 are brought into contact with each other, and rotating the mold 6 about a rotation axis. A measuring device (to be referred to as a first measuring device 14 hereinafter) for measuring the position and orientation of the mold 6 is provided in the imprint apparatus 100, and the control unit 5 controls the mold driving unit 12 based on the position and orientation of the mold 6 measured by the first measuring device 14. The first measuring device 14 can include, for example, a laser interferometer and an encoder. Furthermore, in the imprint apparatus 100 of the first embodiment, the mold driving unit 12 performs an operation of changing the spacing between the mold 6 and the substrate 10. However, this operation may be performed by a substrate driving unit 20 of the substrate stage 4 (to be described later), and may also be relatively performed by both the mold driving unit 12 and the substrate driving unit 20.

A space 13 defined by a surface on the opposite side of the pattern surface 6a of the mold, the mold chuck 11, and the mold driving unit 12 can be provided between the mold 6 and the mold holding unit 3. A deformation unit 15 is connected to the space 13 via a pipe. The deformation unit 15 can deform the pattern surface 6a into a convex shape to bend toward the substrate 10 by changing the pressure of the space 13. When, for example, the mold 6 and the imprint material 16 on the substrate are brought into contact with each other by reducing the spacing between the mold 6 and the substrate 10, the deformation unit 15 changes the pressure of the space 13 to be higher than the external pressure. After the mold 6 and the imprint material 16 are brought into contact with each other, the deformation unit 15 gradually decreases the pressure of the space. This allows the deformation unit 15 to make the mold and the imprint material start contacting each other while the pattern surface 6a is deformed, and to gradually bring the mold 6 and the imprint material 16 into contact with each other from part (for example, the center) of the pattern surface 6a. As a result, it is possible to suppress gas trapped between the imprint material 16 and the concave portions of the pattern formed on the mold 6, and prevent loss of the pattern formed by the imprint material 16. A measuring device (to be referred to as a second measuring device 17 hereinafter) for measuring the pressure of the space 13 is provided in the imprint apparatus 100, and the control unit 5 controls the deformation unit 15 based on the pressure value of the space measured by the second measuring device 17. The second measuring device 17 includes, for example, a pressure sensor, and can be arranged in the space 13 or the pipe.

The substrate stage 4 includes a substrate chuck 19 and the substrate driving unit 20, and aligns the mold 6 and the substrate 10 by moving the substrate 10 in the second directions (X and Y directions) perpendicular to the first direction while the mold 6 and the imprint material 16 are in contact with each other. That is, the substrate stage 4 performs alignment in the in-plane direction perpendicular to the direction (Z direction) in which the mold 6 and the imprint material 16 are brought into contact with each other. The substrate chuck 19 holds the substrate 10 by, for example, a vacuum suction force or an electrostatic force. The substrate driving unit 20, for example, drives the substrate 10 held by the substrate chuck 19 in the X and Y directions. A measuring device (to be referred to as a third measuring device 21 hereinafter) for measuring the position of the substrate 10 is provided in the imprint apparatus 100, and the control unit 5 controls the substrate driving unit 20 based on the position of the substrate 10 measured by the third measuring device 21. The third measuring device 21 can include, for example, a laser interferometer and an encoder. Furthermore, in the imprint apparatus 100 of the first embodiment, the substrate driving unit 20 aligns the mold 6 and the substrate 10. However, this alignment operation may be performed by the mold driving unit 12 of the mold holding unit 3, and may also be relatively performed by both the substrate driving unit 20 and the mold driving unit 12.

The detection unit 23 detects a mark AM1 (alignment mark) formed on the mold 6 and a mark AM2 (alignment mark) formed on the substrate 10 (shot region) while, for example, the mold 6 and the imprint material 16 on the substrate are in contact with each other. This allows the control unit 5 to obtain the relative positions (X and Y directions) of the mark AM1 on the mold and the mark AM2 on the substrate based on the detection result of the detection unit 23, thereby aligning the mold 6 and the substrate 10 so that the relative positions are set to target relative positions. The supply unit 24 supplies the imprint material 16 (uncured resin) onto the substrate. As described above, in the imprint apparatus 100 of the first embodiment, an ultraviolet-curing resin having a property that is cured upon ultraviolet irradiation is used as the imprint material 16.

[Imprint Processing]

The imprint apparatus 100 with the above arrangement according to the first embodiment arranges the shot region below the pattern surface 6a of the mold 6, brings the mold 6 and the imprint material 16 on the substrate into contact with other, and then aligns the mold 6 and the substrate 10 while the mold 6 and the imprint material 16 are in contact with each other. In the imprint apparatus 100, the residual film thickness of the pattern formed by the imprint material (the distance between the surface of the substrate 10 and the bottom surface of the concave portion of the pattern formed by the imprint material 16) is uniformed. For this reason, the imprint apparatus 100 of the first embodiment brings the mold 6 and the imprint material 16 into contact with each other while the mold 6 is inclined according to the inclination of the surface of the substrate 10 so that the surface of the substrate 10 and the pattern surface 6a of the mold 6 are parallel to each other.

While the mold 6 and the imprint material 16 are in contact with each other, it is difficult to change the relative positions of the mold 6 and the substrate 10. Therefore, to quickly align the mold 6 and the substrate 10, the change amounts of the relative positions of the mold 6 and the substrate 10 should be as small as possible in alignment. If the mold 6 is inclined, however, the mark AM1 on the mold shifts in the X and Y directions. Consequently, if the mold 6 and the imprint material 16 are brought into contact with each other while the mold 6 is inclined, the change amounts of the relative positions of the mold 6 and the substrate 10 in alignment may increase by the inclination amount of the mold 6. The imprint apparatus 100 of the first embodiment obtains a shift amount by which the mark AM1 on the mold shifts in the X and Y directions by inclining the mold 6. After changing the relative positions (X and Y directions) of the mold 6 and the substrate 10 according to the shift amount, the imprint apparatus 100 brings the mold 6 and the imprint material 16 into contact with each other. This can prevent the change amounts of the relative positions of the mold 6 and the substrate 10 in alignment from increasing by the inclination amount of the mold 6, and quickly perform alignment. Imprint processing by the imprint apparatus 100 of the first embodiment will be described below.

Figure 2:
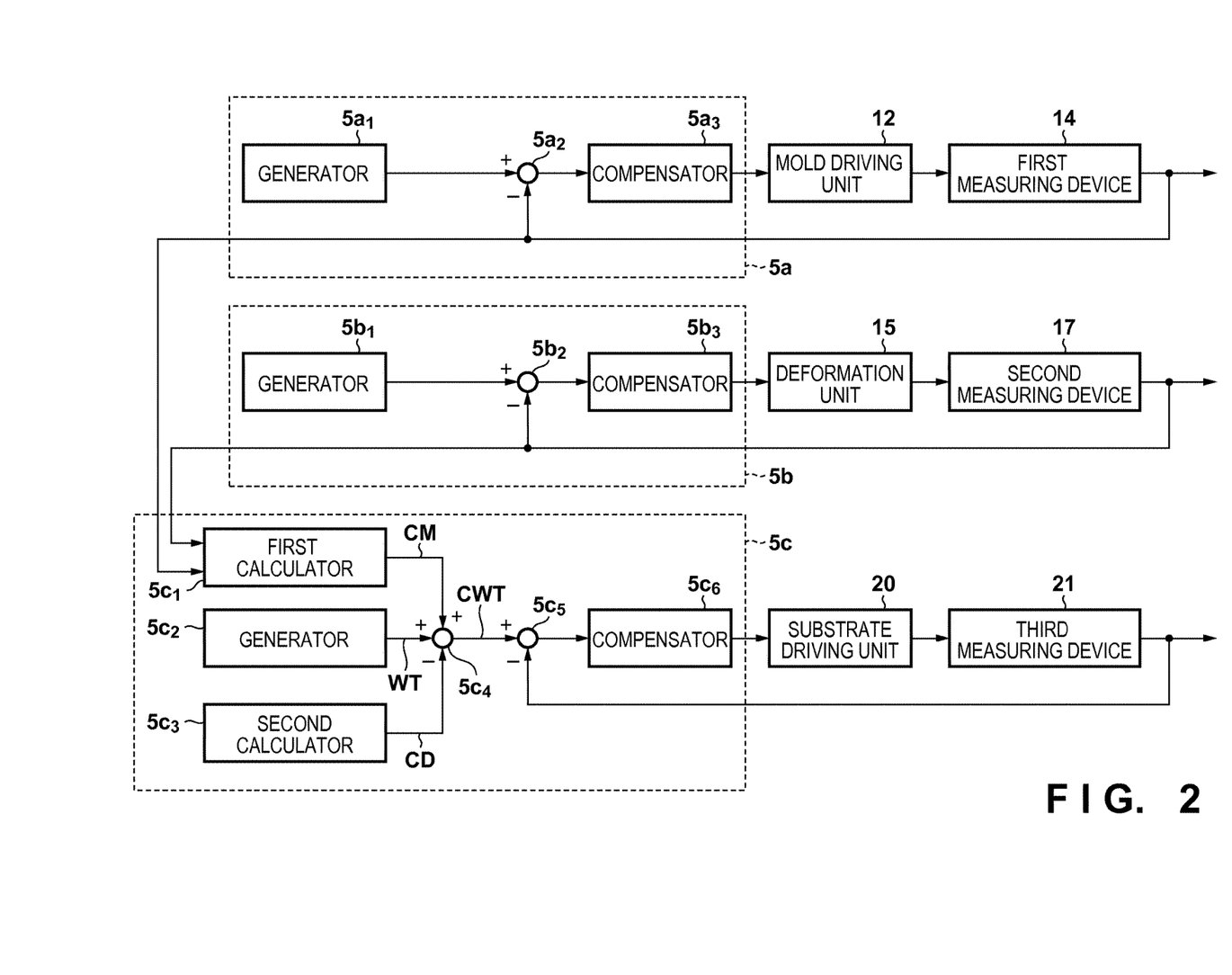
FIG. 2 is a block diagram showing a control system for controlling imprint processing.

A control system for controlling the imprint processing will be explained with reference to FIG. 2. FIG. 2 is a block diagram showing the control system for controlling the imprint processing. The control unit 5 of the first embodiment can include a first control unit 5a for controlling the position (Z direction) and orientation of the mold 6, a second control unit 5b for controlling deformation of the pattern surface 6a, and a third control unit 5c for controlling the position (X and Y directions) of the substrate 10. The first control unit 5a causes a subtracter $5a_2$ to obtain deviations between the position and orientation of the mold 6 measured by the first measuring device 14 and the target position and target orientation of the mold 6 generated by a generator $5a_1$, respectively. The first control unit 5a causes a compensator $5a_3$ to decide, based on the deviations obtained by the subtracter $5a_2$, a command value to be provided to the mold driving unit 12. The second control unit 5b causes a subtracter $5b_2$ to obtain a deviation between the pressure value of the space 13 measured by the second measuring device 17 and a target pressure value generated by a generator $5b_1$, and causes a compensator $5b_3$ to decide, based on the deviation obtained by the subtracter $5b_2$, a command value to be provided to the deformation unit 15.

The third control unit 5c causes an adder $5c_4$ to add a correction value CM calculated by a first calculator $5c$ 1or a correction value CD calculated by a second calculator $5c_3$ to a target position WT of the substrate 10 generated by a generator $5c_2$. The third control unit 5c causes a subtracter $5c_5$ to obtain a deviation between the position of the substrate 10 measured by the third measuring device 21 and a value CWT (the target position WT corrected by the correction value CM or CD) output from the adder $5c_4$. The third control unit 5c causes a compensator $5c_6$ to decide, based on the deviation obtained by the subtracter, a command value to be provided to the substrate driving unit 20.

By using the measurement result of the first measuring device 14 and that of the second measuring device 17, the first calculator $5c_1$ calculates shift amounts by which the relative positions of the mold 6 and the substrate 10 shift in the X and Y directions by inclining the mold 6. The first calculator $5c_1$ outputs the correction value CM for correcting the relative positions of the mold 6 and the substrate 10 so as to decrease the calculated shift amounts. Before the mold 6 and the imprint material 16 are brought into contact with each other, the adder $5c_4$ adds the correction value CM output from the first calculator $5a_1$ to the target position WT. On the other hand, based on the detection result of the detection unit 23, the second calculator $5c_3$ outputs the correction value CD for correcting the relative positions of the mold 6 and the substrate 10 so that the relative positions of the mark AM1 on the mold and the mark AM2 on the substrate are set to target relative positions. During alignment between the mold 6 and the substrate 10 while the mold 6 and the imprint material 16 are in contact with each other, the adder $5c_4$ adds the correction value CD output from the second calculator $5c_3$ to the target position WT. As described above, before the mold 6 and the imprint material 16 are brought into contact with each other, the correction value CM is added to the target position WT. On the other hand, during alignment while the mold 6 and the imprint material 16 are in contact with each other, the correction value CD is added to the target position WT.

Figure 3:
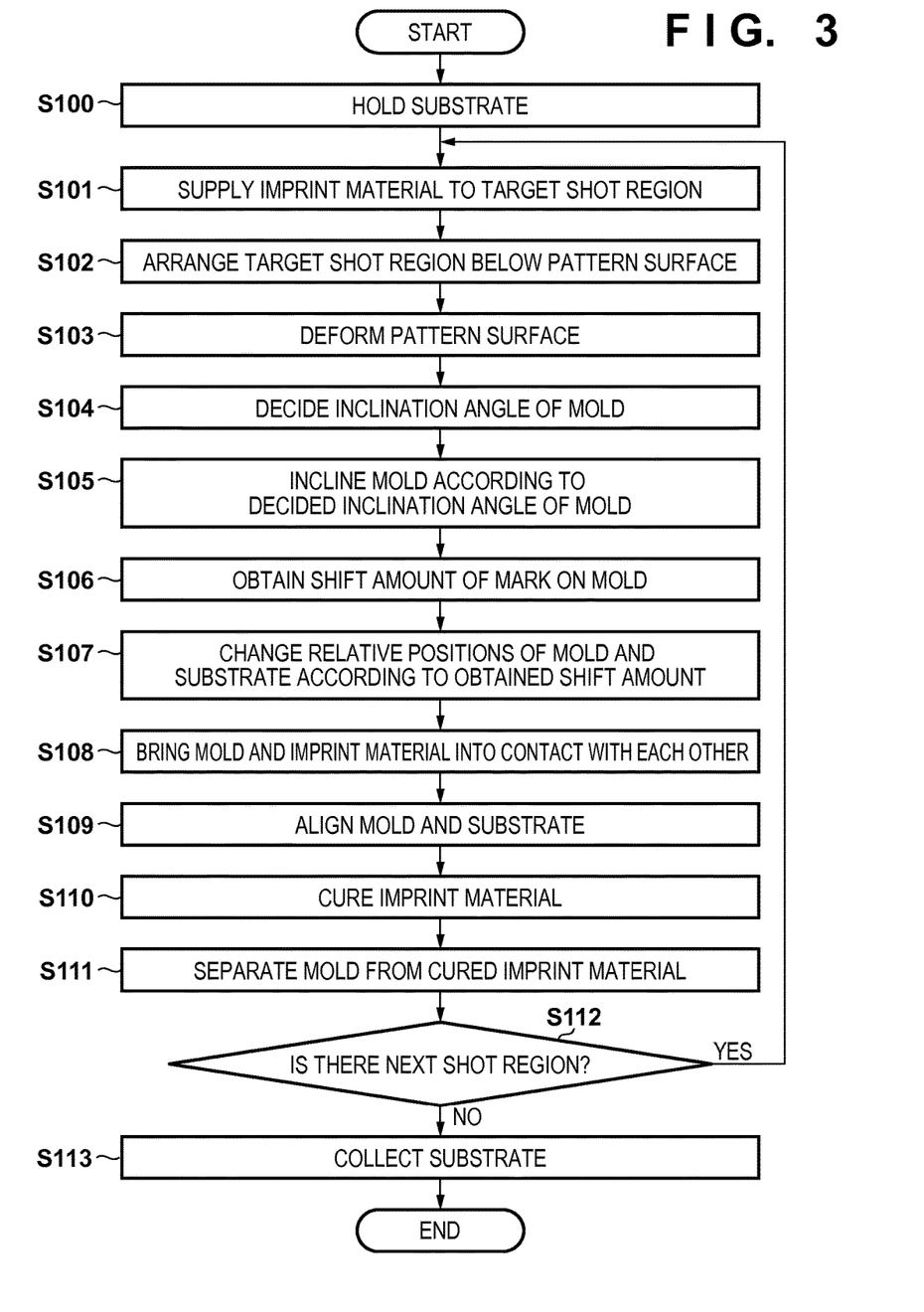
FIG. 3 is a flowchart illustrating imprint processing by the imprint apparatus according to the first embodiment.

The procedure of the imprint processing by the imprint apparatus 100 of the first embodiment will now be described with reference to FIG. 3. FIG. 3 is a flowchart illustrating the imprint processing by the imprint apparatus 100 of the first embodiment. The imprint processing shown in FIG. 3 can be performed when the control unit 5 comprehensively controls the respective units of the imprint apparatus 100.

Figure 4:
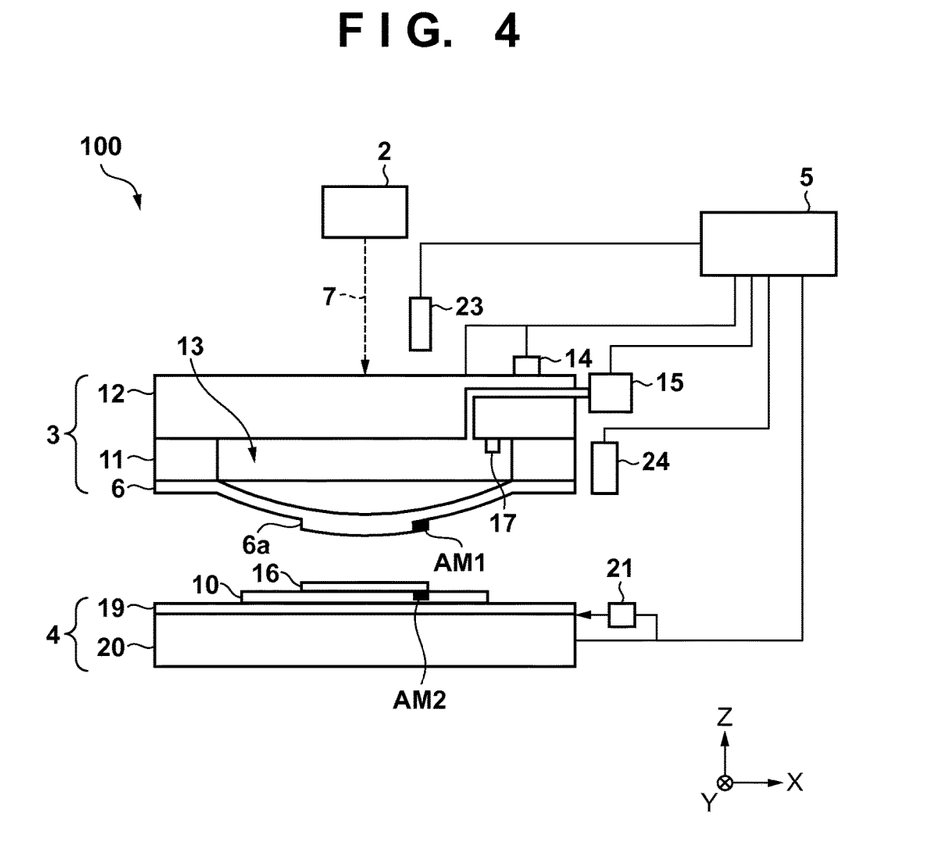
FIG. 4 is a view showing a state in which the pattern surface of a mold is deformed.

In step S100, the control unit 5 controls a substrate conveyance mechanism (not shown) to convey the substrate 10 to a position above the substrate chuck 19, and controls the substrate stage 4 to hold the substrate 10. This mounts the substrate 10 on the substrate stage 4. In step S101, the control unit 5 controls the substrate stage 4 to arrange a shot region (to be referred to as a target shot region hereinafter) to undergo the imprint processing below the supply unit 24, and controls the supply unit 24 to supply the imprint material 16 to the target shot region. In step S102, the control unit 5 controls the substrate stage 4 to arrange the target shot region below the pattern surface 6a of the mold 6. In step S103, the control unit 5 controls the deformation unit 15 to deform the pattern surface 6a of the mold 6 into a convex shape to bend toward the substrate 10, as shown in FIG. 4. FIG. 4 is a view showing a state in which the pattern surface 6a of the mold 6 is deformed. In this case, the control unit 5 may set the same value or different values for a plurality of shot regions formed on the substrate 10 as the pressure value of the space 13 when performing imprint processing for each of the plurality of shot regions.

In step S104, in accordance with the inclination of the surface of the substrate 10 (target shot region), the control unit 5 decides an angle (the inclination angle of the mold) at which the mold 6 is inclined so that the pattern surface 6a and the surface of the substrate 10 are parallel to each other when the deformation unit 15 does not deform the pattern surface. The control unit 5 decides an inclination angle MT=(MTx, MTy) of the mold 6 to coincide with the inclination WT=(WTx, WTy) of the surface of the substrate 10. The components MTx and MTy represent the inclination angle of the mold 6 in the X direction and the inclination angle of the mold 6 in the Y direction, respectively, and the components WTx and WTy represent the inclination of the surface of the substrate 10 in the X direction and the inclination of the surface of the substrate 10 in the Y direction, respectively. The inclination of the surface of the substrate 10 is caused not only by the substrate itself but also by the substrate chuck 19 such as the inclination of the holding surface of the substrate chuck 19 or the holding state of the substrate 10 by the substrate chuck 19. Therefore, the inclination of the surface of the substrate 10 may be measured while the substrate 10 is held by the substrate chuck 19. For example, the inclination of the surface of the substrate 10 can be obtained by causing the detection unit 23 to detect each mark on the substrate before the start of the imprint processing, and obtaining the focus position at this time. In the example shown in FIG. 3, the step (step S104) of deciding the inclination angle of the mold 6 is performed after the step (step S103) of deforming the pattern surface 6a. The present invention, however, is not limited to this, and step S104 may be performed before the pattern surface 6a is deformed (before step S103). For example, it is possible to obtain the inclination of the surface of the substrate 10 by measuring the height within the substrate surface using the detection unit provided in the apparatus after the substrate is loaded into the apparatus. A detection unit different from the detection unit 23 may be provided in the imprint apparatus.

Figure 5A:
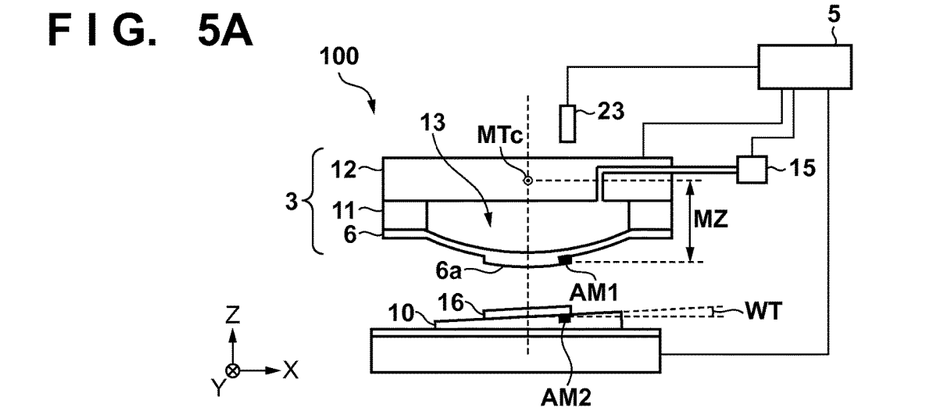
FIG. 5A is a schematic view showing the imprint apparatus which is performing imprint processing.
Figure 5B:
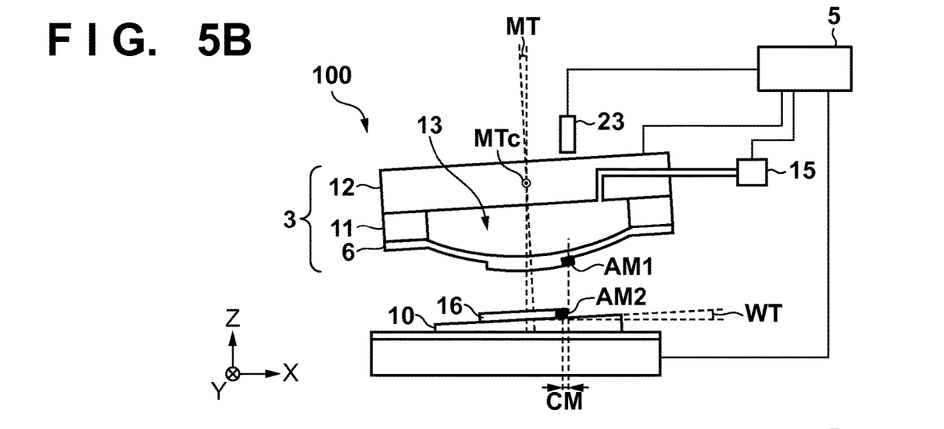
FIG. 5B is a schematic view showing the imprint apparatus which is performing imprint processing.

In step S105, the control unit 5 causes the mold holding unit 3 to incline the mold 6 according to the inclination angle of the mold 6 decided in step S104. The mold holding unit 3 is configured to incline the mold 6 about a rotation axis MTc, as described above. FIG. 5A and FIG. 5B are schematic views showing the imprint apparatus 100 before and after the mold 6 is inclined. In step S105, as shown in FIG. 5B, the mold 6 is inclined about the rotation axis MTc according to the inclination angle MT of the mold 6 decided based on the inclination WT of the surface of the substrate 10.

In step S106, the control unit 5 obtains the shift amount CM by which the mark AM1 on the mold shifts in the X and Y directions by inclining the mold 6 while the deformation unit 15 deforms the pattern surface 6a. In the example of FIG. 3, the step (step S106) of obtaining the shift amount CM is performed after the step (step S105) of inclining the mold 6. The present invention, however, is not limited to this, and step S106 may be performed before the mold 6 is inclined (before step S105). An example of a method of obtaining the shift amount CM by the control unit 5 (first calculator $5c_1$) will be explained with reference to FIG. 5B. In the following description, MTc represents the rotation axis about which the mold 6 is inclined, and MZ represents the distance (Z direction) between the rotation axis MTc and the mark AM1 on the mold while the pattern surface 6a is deformed before the mold 6 is inclined.

The control unit 5 obtains the distance MZ using the pressure value of the space 13 and information indicating the relationship between the pressure value of the space 13 and a displacement amount in the Z direction of the mark AM1 on the mold. In the first embodiment, the control unit 5 obtains the distance MZ using, as the information indicating the relationship between the pressure value and the displacement amount, a coefficient α for converting the pressure value of the space 13 into the displacement amount in the Z direction of the mark AM1 on the mold according to:

$$MZ = \alpha \times P1 + \beta \quad (1)$$

where P1 represents the pressure value of the space 13 detected by the second measuring device 17, and β represents the distance (Z direction) between the rotation axis MTc and the mark AM1 on the mold before the deformation unit 15 deforms the pattern surface 6a. The distance β can be obtained in advance before the imprint processing. By obtaining the distance MZ, the control unit 5 can obtain the X and Y components (CMx and CMy) of the shift amount CM using the inclination angle MT of the mold 6 and the distance MZ according to:

$$CMx \approx MZ \times \tan MTx \quad (2)$$

$$CMy \approx MZ \times \tan MTy \quad (3)$$

As the information indicating the relationship between the pressure value and the displacement amount, for example, a function or table indicating the relationship between the pressure value and the displacement amount can be used instead of the coefficient for converting the pressure value of the space 13 into the displacement amount of the mark AM1 on the mold.

Figure 5C:
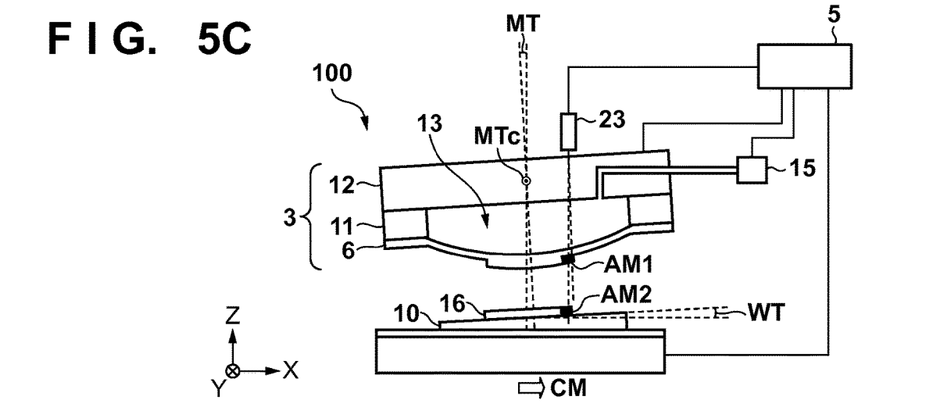
FIG. 5C is a schematic view showing the imprint apparatus which is performing imprint processing.
Figure 6A:
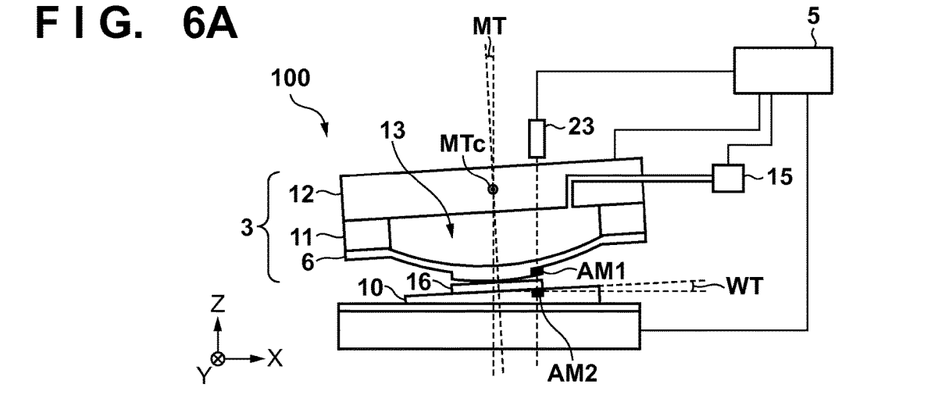
FIG. 6A is a schematic view showing the imprint apparatus which is performing imprint processing.
Figure 6B:
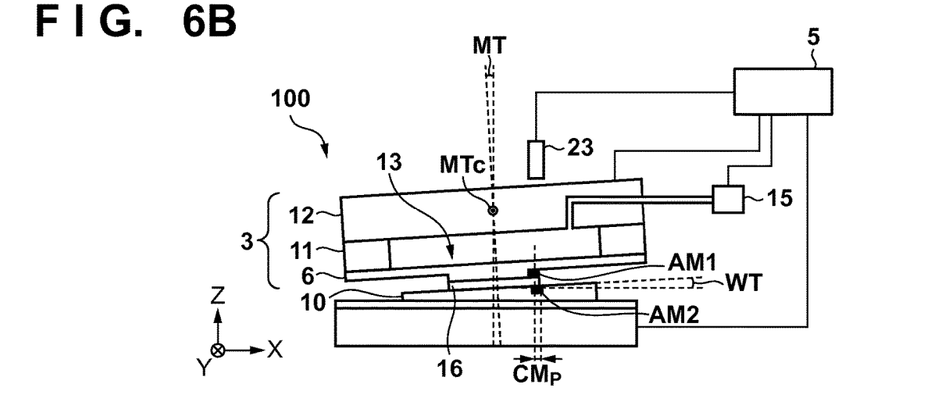
FIG. 6B is a schematic view showing the imprint apparatus which is performing imprint processing.

In step S107, as shown in FIG. 5C, the control unit 5 changes the relative positions (X and Y directions) of the mold 6 and the substrate 10 according to the shift amount CM obtained in step S106. FIG. 5C is a schematic view showing the imprint apparatus 100 after the relative positions of the mold 6 and the substrate 10 are changed. In step S108, the control unit 5 controls the mold holding unit 3 to reduce the spacing between the mold 6 and the substrate 10, thereby bringing the mold 6 and the imprint material 16 into contact with each other. As shown in FIG. 6A, the control unit 5 controls the deformation unit 15 so as to gradually decrease the pressure of the space 13 after the mold 6 and the imprint material 16 are brought into contact with each other. This allows the control unit 5 to bring the mold 6 and the imprint material 16 into contact with each other so that the pattern surface 6a of the mold 6 and the surface of the substrate 10 are parallel to each other, as shown in FIG. 6B.

Figure 6C:
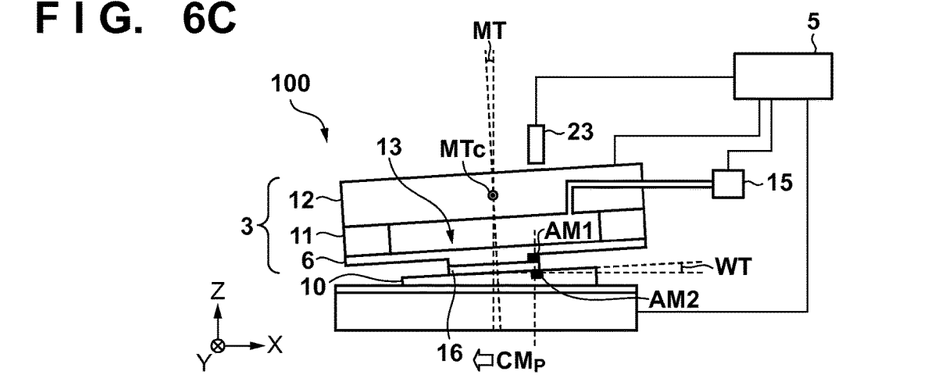
FIG. 6C is a schematic view showing the imprint apparatus which is performing imprint processing.

In step S109, while the mold 6 and the imprint material 16 are in contact with each other, the control unit 5 aligns the mold 6 and the substrate 10 based on the detection result of the detection unit 23 by keeping the mold 6 inclined. As shown in FIG. 6C, the control unit 5 aligns the mold 6 and the substrate 10 so as to correct a position shift amount CMp between the mark AM1 on the mold and the mark AM2 on the substrate while the mold 6 and the imprint material 16 are in contact with each other. The imprint apparatus 100 of the first embodiment changes the relative positions of the mold 6 and the substrate 10 before the mold 6 and the imprint material 16 are brought into contact with each other so as to correct the shift amount CM caused by inclining the mold 6. In alignment while the mold 6 and the imprint material 16 are in contact with each other, it is only necessary to correct the position shift amount CMp between the mark AM1 on the mold and the mark AM2 on the substrate, as shown in FIG. 6B. On the other hand, if no relative positions are changed before the mold 6 and the imprint material 16 are brought into contact with each other, it is necessary to correct the total amount of the shift amount CM and the position shift amount CMp in alignment. That is, the imprint apparatus 100 of the first embodiment can decrease the change amounts of the relative positions of the mold 6 and the substrate 10 in alignment, as compared with a case in which no relative positions are changed before the mold 6 and the imprint material 16 are brought into contact with each other.

In step S110, the control unit 5 controls the irradiation unit 2 to irradiate, with ultraviolet rays, the imprint material 16 which is in contact with the mold 6, thereby curing the imprint material 16. In step S111, the control unit 5 controls the mold holding unit 3 to widen the spacing between the mold 6 and the substrate 10, thereby separating (releasing) the mold 6 from the cured imprint material 16. In step S112, the control unit 5 determines whether a shot region (next shot region) to which the pattern of the mold 6 is continuously transferred exists on the substrate. If the next shot region exists, the process returns to step S101; otherwise, the process advances to step S113. In step S113, the control unit 5 controls the substrate conveyance mechanism (not shown) to collect the substrate 10 from the substrate stage 4.

As described above, the imprint apparatus 100 of the first embodiment obtains the shift amount of the mark on the mold, which is caused by inclining the mold 6, and changes the relative positions of the mold 6 and the substrate 10 according to the shift amount before the mold 6 and the imprint material 16 are brought into contact with each other. This enables the imprint apparatus 100 to prevent the change amounts of the relative positions of the mold 6 and the substrate 10 from increasing by the inclination amount of the mold 6 in alignment, and to quickly perform alignment. The imprint apparatus 100 of the first embodiment causes the deformation unit 15 to deform the pattern surface 6a of the mold 6 when the mold 6 and the imprint material 16 are brought into contact with each other while the mold 6 is inclined. The present invention, however, is not limited to this. For example, the mold 6 and the imprint material 16 may be brought into contact with each other while the mold 6 is inclined without causing the deformation unit 15 to deform the pattern surface 6a. In this case, the shift amount (X and Y directions) of the mark AM1 on the mold, which is caused by inclining the mold 6, can be obtained based on the inclination angle of the mold 6 and the distance β between the rotation axis MTc and the mark AM1 on the mold while the pattern surface 6a is not deformed.

<Second Embodiment>

Figure 7:
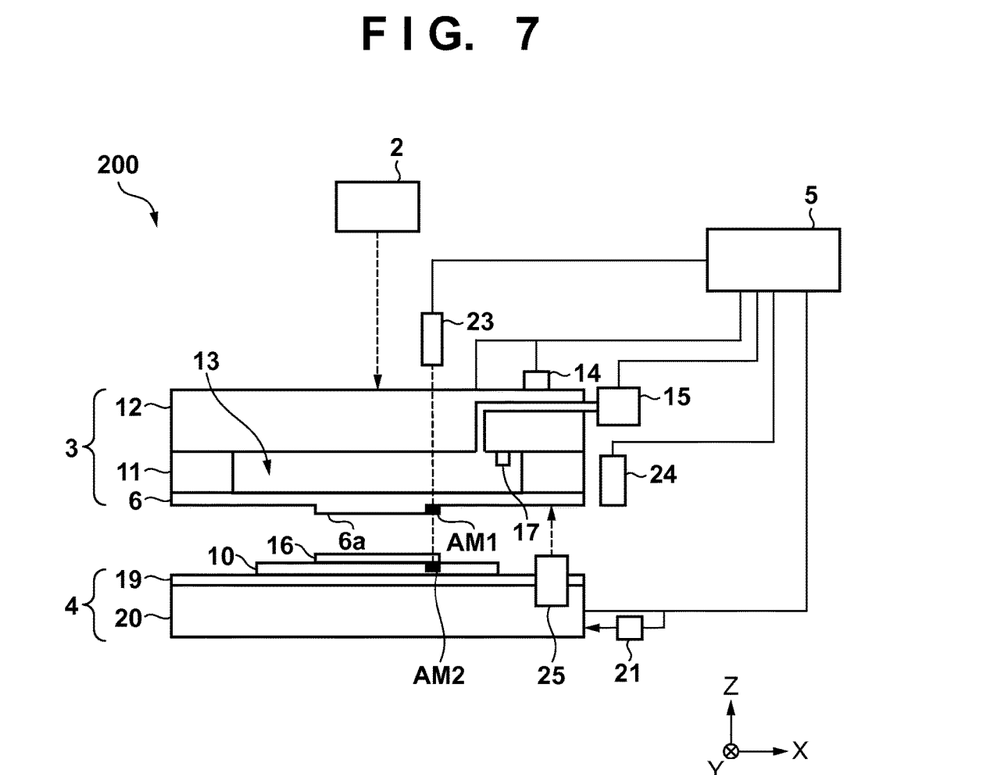
FIG. 7 is a schematic view showing an imprint apparatus according to the second embodiment.

An imprint apparatus 200 according to the second embodiment of the present invention will be described. FIG. 7 is a schematic view showing the imprint apparatus 200 according to the second embodiment. The imprint apparatus 200 of the second embodiment further includes a measurement unit 25 for measuring the position of a pattern surface 6a of a mold 6 in the Z direction (first direction), as compared with the imprint apparatus 100 of the first embodiment. The measurement unit 25 can include, for example, a laser interferometer. The measurement unit 25 can irradiate the pattern surface 6a with light (a laser beam) from the laser interferometer, and measure the position (Z direction) of the pattern surface 6a based on light reflected by the pattern surface 6a. In the imprint apparatus 200 of the second embodiment, components other than the measurement unit 25 are the same as those of the imprint apparatus 100 of the first embodiment and a description thereof will be omitted.

Figure 8:
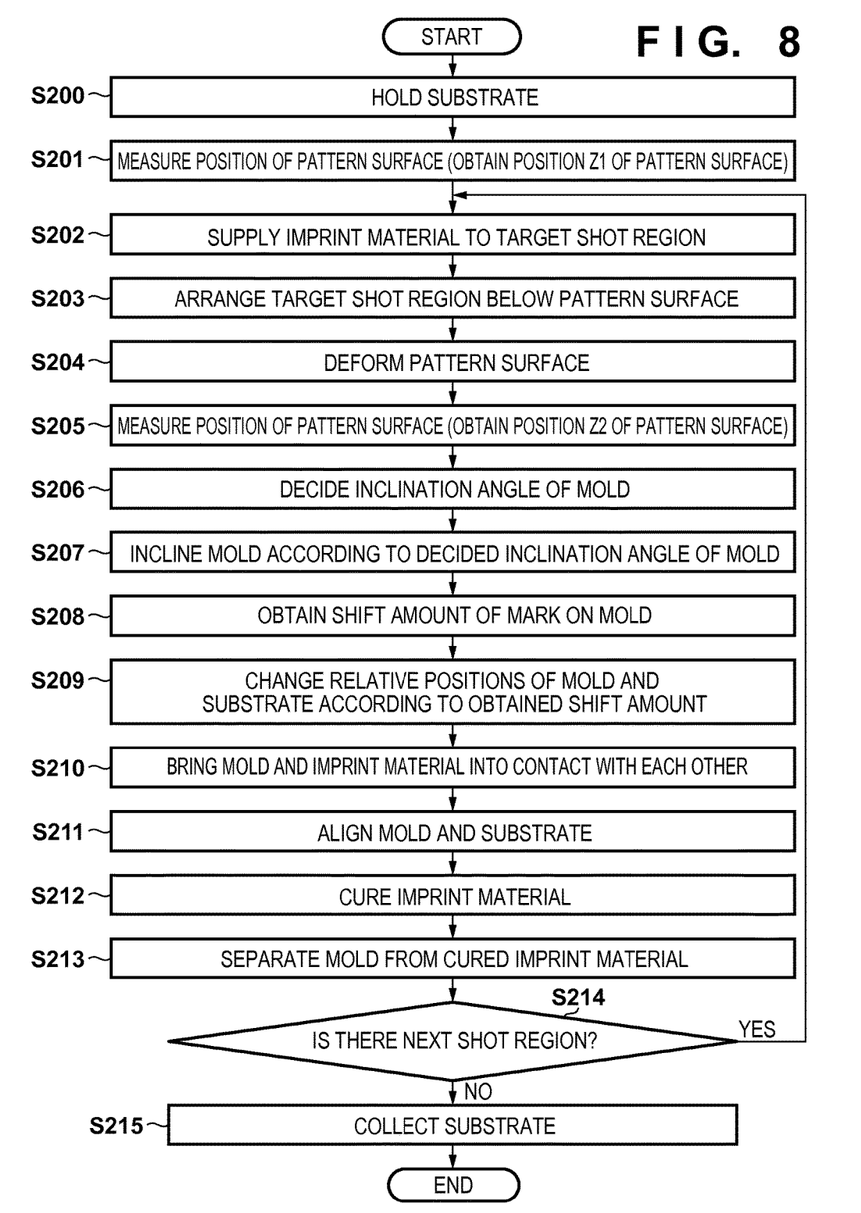
FIG. 8 is a flowchart illustrating imprint processing by the imprint apparatus according to the second embodiment.

The procedure of imprint processing by the imprint apparatus 200 of the second embodiment will be described with reference to FIG. 8. FIG. 8 is a flowchart illustrating the imprint processing by the imprint apparatus 200 of the second embodiment. The imprint processing shown in FIG. 8 can be performed when a control unit 5 comprehensively controls the respective units of the imprint apparatus 200.

In step S200, the control unit 5 controls a substrate conveyance mechanism (not shown) to convey a substrate 10 to a position above a substrate chuck 19, and controls a substrate stage 4 to hold the substrate 10. In step S201, the control unit 5 causes the measurement unit 25 to measure the position (Z direction) of the pattern surface 6a of the mold 6. This enables the control unit 5 to obtain a position Z1 in the Z direction of the pattern surface 6a while a deformation unit 15 does not deform the pattern surface 6a of the mold 6. In step S202, the control unit 5 controls the substrate stage 4 to arrange a target shot region below a supply unit 24, and controls the supply unit 24 to supply an imprint material 16 to the target shot region. In step S203, the control unit 5 controls the substrate stage 4 to arrange the target shot region below the pattern surface 6a of the mold 6. In step S204, the control unit 5 causes the deformation unit 15 to deform the pattern surface 6a of the mold 6. In step S205, the control unit 5 causes the measurement unit 25 to measure the position (Z direction) of the pattern surface 6a of the mold 6. This enables the control unit 5 to obtain a position Z2 in the Z direction of the pattern surface 6a while the deformation unit 15 deforms the pattern surface 6a of the mold 6.

In step S206, the control unit 5 decides the inclination angle of the mold 6. In step S207, the control unit 5 causes a mold holding unit 3 to incline the mold 6 according to the inclination angle of the mold 6 decided in step S206. The processes in steps S206 and S207 are the same as those in steps S104 and S105 of the first embodiment and a detailed description thereof will be omitted.

In step S208, the control unit 5 obtains a shift amount CM by which a mark AM1 on the mold shifts in the X and Y directions by inclining the mold 6 while the deformation unit 15 deforms the pattern surface 6a. In the second embodiment, the control unit 5 obtains a distance MZ using the position Z1 obtained in step S201 and the position Z2 obtained in step S205 according to:

$$MZ=|Z1-Z2|+\beta \qquad (4)$$

where β represents the distance (Z direction) between a rotation axis MTc and the mark AM1 on the mold before the deformation unit 15 deforms the pattern surface 6a, similarly to equation (1). By obtaining the distance MZ, the control unit 5 can obtain the X and Y components (CMx and CMy) of the shift amount CM using the inclination angle MT of the mold 6 and the distance MZ according to expressions (2) and (3).

In step S209, the control unit 5 changes the relative positions of the mold 6 and the substrate 10 according to the shift amount CM obtained in step S208. In step S210, the control unit 5 controls the mold holding unit 3 to reduce the spacing between the mold 6 and the substrate 10, thereby bringing the mold 6 and the imprint material 16 into contact with each other. In step S211, while the mold 6 and the imprint material 16 are in contact with each other, the control unit 5 aligns the mold 6 and the substrate 10 based on the detection result of a detection unit 23 by keeping the mold 6 inclined. The processes in steps S212 to S215 are the same as those in steps S110 to S113 of the first embodiment and a description thereof will be omitted.

As described above, the imprint apparatus 200 of the second embodiment includes the measurement unit 25 for measuring the position of the pattern surface 6a of the mold 6 in the Z direction. The imprint apparatus 200 causes the measurement unit 25 to measure the position of the pattern surface before and after the deformation unit 15 deforms the pattern surface 6a. The imprint apparatus 200 obtains the shift amount of the mark AM1 on the mold, which is caused by inclining the mold 6, by using the measurement results, and changes the relative positions of the mold 6 and the substrate 10 according to the shift amount before the mold 6 and the imprint material 16 are brought into contact with each other. This allows the imprint apparatus 200 to prevent the change amounts of the relative positions of the mold 6 and the substrate 10 from increasing by the inclination amount of the mold 6 in alignment, and to quickly perform alignment.

<Third Embodiment>

An imprint apparatus according to the third embodiment of the present invention will be described. The imprint apparatus according to the third embodiment has the same apparatus arrangement as that of the imprint apparatus 100 of the first embodiment and a description thereof will be omitted.

To raise the yield, the imprint apparatus is required to perform imprint processing for a shot region (deficient shot region) which is arranged in the peripheral portion of a substrate 10 and to which only part of the pattern of a mold 6 is transferred. To do this, even in the imprint processing of a deficient shot region, the spacing between the mold 6 and the substrate 10 is reduced while a pattern surface 6a of the mold 6 is deformed, and the mold 6 and an imprint material 16 are gradually brought into contact with each other from the center of the pattern surface 6a of the mold 6.

Figure 9A:
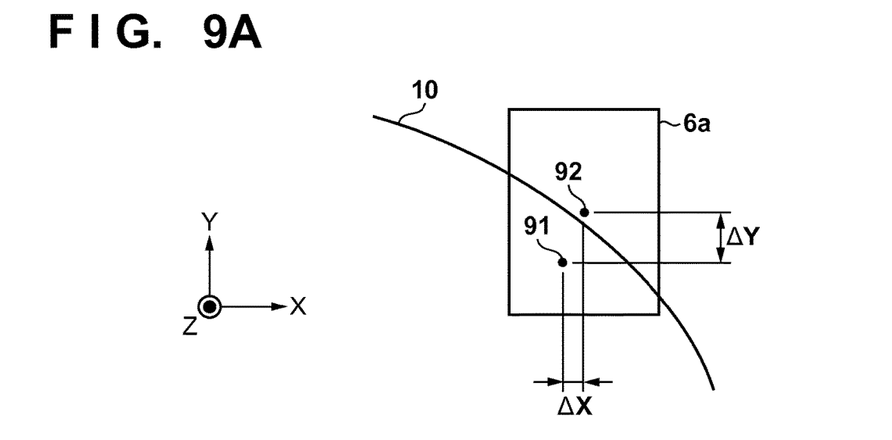
FIG. 9A is a view for explaining imprint processing of a deficient shot region.
Figure 9B:
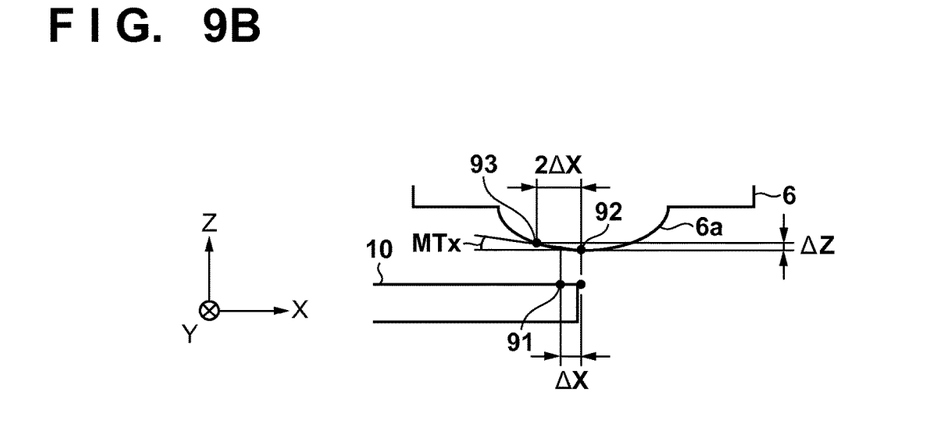
FIG. 9B is a view for explaining imprint processing of a deficient shot region.
Figure 9C:
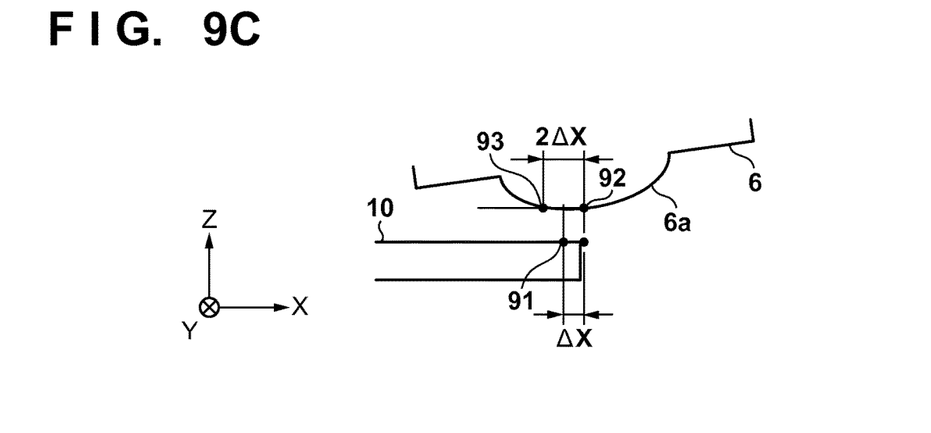
FIG. 9C is a view for explaining imprint processing of a deficient shot region.

When the mold 6 and the imprint material 16 are brought into contact with each other in the imprint processing of a deficient shot region, the center of the pattern surface 6a of the mold 6 may fall outside the substrate 10 in the X and Y directions, as shown in FIG. 9A. In this situation, if the spacing between the mold 6 and the substrate 10 is reduced without inclining the mold 6 as shown in FIG. 9B, the pattern surface 6a of the mold 6 may be brought into contact with the edge of the substrate 10, thereby causing damage such as a flaw to the pattern surface 6a. To prevent this, the mold 6 and the imprint material 16 may be brought into contact with each other while the pattern surface 6a is deformed and the mold 6 is inclined so that the mold 6 and the imprint material 16 start contacting each other from a target position on the deficient shot region (see FIG. 9C). When the mold 6 is inclined, however, a position (to be referred to as a corresponding position hereinafter) on the pattern surface 6a on which the pattern to be transferred to the target position on the deficient shot region is formed shifts in the X and Y directions (second directions). As a result, it may become difficult to first bring the corresponding position on the pattern surface 6a into contact with the imprint material 16 at the target position on the deficient shot region, and gradually bring the mold 6 and the imprint material 16 into contact with each other from the target position.

The imprint apparatus of the third embodiment obtains a shift amount by which the corresponding position shifts in the X and Y directions (second directions) by inclining the mold 6. After changing the relative positions (X and Y directions) of the mold 6 and the substrate 10 according to the shift amount, the imprint apparatus brings the mold 6 and the imprint material 16 into contact with each other. This can prevent the pattern surface 6a of the mold 6 from being brought into contact with the edge of the substrate 10, and the mold 6 and the imprint material 16 can start contacting each other from the target position on the deficient shot region. The corresponding position on the pattern surface 6a may shift in the X and Y directions by inclining the mold 6 also in a case other than that in which the mold 6 and the imprint material 16 are brought into contact with each other from the target position on the deficient shot region. For example, even when the mold 6 and the imprint material 16 are brought into contact with each other from a target position on a shot region (complete shot region) to which the entire pattern of the mold 6 is transferred, a corresponding position on the pattern surface 6a may shift. The target position can include the barycenter of the shot region (deficient shot region or complete shot region).

The procedure of imprint processing by the imprint apparatus of the third embodiment will now be described. The imprint apparatus of the third embodiment performs the imprint processing according to the flowchart shown in FIG. 3 by comprehensively controlling the respective units of the imprint apparatus by a control unit 5. In the imprint processing performed by the imprint apparatus of the third embodiment, especially a step of deciding the inclination angle of the mold 6 and a step of bringing the mold and the imprint material into contact with each other are different from those of the imprint processing performed by the imprint apparatus 100 of the first embodiment. Processes in steps S104 to S110 of the flowchart shown in FIG. 3 will be explained below. Processes other than those in steps S104 to S110 are the same as those of the imprint processing performed by the imprint apparatus 100 of the first embodiment.

In step S104, the control unit 5 decides an angle (the inclination angle of the mold) at which the mold 6 is inclined so that the mold 6 and the imprint material 16 start contacting each other from a target position on a target shot region. The control unit 5 obtains the distance ($\Delta X$ and $\Delta Y$) between a target position 91 (for example, the barycenter) on the target shot region and a center 92 of the pattern surface 6a, as shown in FIG. 9A. The target position 91 on the target shot region may be decided in advance using arrangement information of shot regions on the substrate or decided based on an image obtained by capturing the target shot region. The control unit 5 obtains inclination angle components $M_{Tx}$ and $M_{Ty}$ of the mold 6 using the obtained distance components $\Delta X$ and $\Delta Y$ according to:

$$MTx = a\sin(\Delta Zx/2\Delta X) \approx \Delta Zx/2\Delta X \quad (5)$$

$$MTy = a\sin(\Delta Zy/2\Delta Y) \approx \Delta Zy/2\Delta Y \quad (6)$$

where $\Delta Zx$ represents the positional difference in the Z direction between the center 92 of the pattern surface 6a and a point 93 on the pattern surface 6a away from the center 92 of the pattern surface 6a by twice the distance $\Delta X$ ($2\Delta X$), as shown in FIG. 9B. Similarly, $\Delta Zy$ represents the positional difference in the Z direction between the center 92 of the pattern surface 6a and a point on the pattern surface away from the center 92 of the pattern surface 6a by twice the distance $\Delta Y$ ($2\Delta Y$).

In step S105, the control unit 5 causes a mold holding unit 3 to incline the mold 6 according to the inclination angle of the mold 6 decided in step S304. In step S106, the control unit 5 obtains a shift amount CM by which the corresponding position on the pattern surface 6a shifts in the X and Y directions by inclining the mold 6 while a deformation unit 15 deforms the pattern surface 6a. The shift amount CM of the corresponding position on the pattern surface 6a can be obtained by a method similar to that described in the first embodiment. In step S107, the control unit 5 changes the relative positions of the mold 6 and the substrate 10 according to the shift amount CM obtained in step S106. In step S108, the control unit 5 controls the mold holding unit 3 to reduce the spacing between the mold 6 and the substrate 10, thereby bringing the mold 6 and the imprint material 16 into contact with each other. At this time, the control unit 5 controls the deformation unit 15 so as to gradually decrease the pressure of a space 13 after the mold 6 and the imprint material 16 are brought into contact with each other. Also, the control unit 5 causes the mold holding unit 3 to gradually change the inclination of the mold 6 so that the pattern surface 6*a* of the mold 6 and the surface of the substrate 10 become parallel to each other when the spacing between the mold 6 and the substrate 10 reaches a target spacing.

As described above, the imprint apparatus of the third embodiment brings the mold 6 and the imprint material 16 into contact with each other while the pattern surface 6*a* is deformed and the mold 6 is inclined so that the mold 6 and the imprint material 16 start contacting each other from the target position on the shot region. The imprint apparatus obtains a shift amount by which the corresponding position on the pattern surface 6*a* shifts in the X and Y directions (second directions) by inclining the mold 6, and changes the relative positions of the mold 6 and the substrate 10 according to the shift amount before the mold 6 and the imprint material 16 are brought into contact with each other. This allows the imprint apparatus of the third embodiment to prevent the pattern surface 6*a* of the mold 6 from being brought into contact with the edge of the substrate 10, and the mold 6 and the imprint material 16 can start contacting each other from the target position on the shot region.

<Embodiment of Method of Manufacturing Article>

A method of manufacturing an article according to an embodiment of the present invention is suitable for manufacturing an article, for example, a microdevice such as a semiconductor device or an element having a microstructure. The method of manufacturing an article according to this embodiment includes a step of forming a pattern on a resin applied onto a substrate by using the above-described imprint apparatus (a step of performing imprint processing on the substrate), and a step of processing the substrate (the substrate having undergone the imprint processing) on which the pattern is formed in the above step. This manufacturing method further includes other well-known steps (for example, oxidation, film formation, deposition, doping, planarization, etching, resist removal, dicing, bonding, and packaging). When compared to the conventional methods, the method of manufacturing an article according to this embodiment is advantageous in at least one of the performance, quality, productivity, and production cost of an article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. An imprint apparatus which forms a pattern of an imprint material on a substrate by using a mold including a pattern surface on which a pattern is formed, comprising:
    a driver configured to relatively drive the mold and the substrate to change a relative position and a relative orientation of the mold and the substrate; and
    a controller configured to control the driver to:
    arrange the mold and the substrate based on a target relative position set in advance, in a second direction perpendicular to a first direction for bringing the mold and the imprint material into contact with each other,
    incline the mold so that a surface of the substrate and the pattern surface have a target relative inclination, and then
    bring the mold and the imprint material on the substrate into contact with each other in a state where the mold is inclined relative to the substrate,
    wherein before bringing the mold and the imprint material into contact with each other, the controller is configured to estimate a shift amount by which a mark on the mold shifts relative to the substrate in the second direction due to the inclining of the mold, based on an inclination angle of the mold, and to cause the driver to relatively drive the mold and the substrate in the second direction so as to correct for the estimated shift amount.

2. The imprint apparatus according to claim 1, wherein the controller performs an alignment between the mold and the substrate while keeping an inclination of the mold, in a state where the mold and the imprint material are in contact with each other.

3. The imprint apparatus according to claim 1, further comprising a deformation device configured to deform the pattern surface into a convex shape to bend toward the substrate,
    wherein the controller estimates, as the shift amount, an amount by which the mark on the mold shifts relative to the substrate in the second direction by inclining the mold while the deformation device deforms the pattern surface.

4. The imprint apparatus according to claim 3, wherein
    the driver is configured to incline the mold about a rotation axis, and
    the controller estimates the shift amount using an angle at which the mold is inclined and a distance in the first direction between the mark on the mold and the rotation axis while the pattern surface is deformed before the mold is inclined.

5. The imprint apparatus according to claim 4, wherein
    the deformation device deforms the pattern surface by changing a pressure of a space between the mold and a holder holding the mold, and
    the controller obtains the distance using information indicating a relationship between a pressure value of the space and a displacement amount in the first direction of the mark on the mold.

6. The imprint apparatus according to claim 4, further comprising a measurement device configured to measure a position of the pattern surface in the first direction,
    wherein the controller causes the measurement device to measure the position of the pattern surface before and after the deformation device deforms the pattern surface, and obtains the distance using measurement results.

7. The imprint apparatus according to claim 1, further comprising a detector configured to detect a mark on the substrate through the mark on the mold,
    wherein after the contacting step, the controller controls alignment between the mold and the substrate based on detection results of the detector, while keeping an inclination of the mold.

8. The imprint apparatus according to claim 7, wherein before the contacting step, the controller causes the driver to relatively drive the mold and the substrate without using detection results of the detector.

9. The imprint apparatus according to claim 1, wherein the controller is configured to cause the driver to incline the mold in accordance with an inclination of the surface of the substrate, so that the surface of the substrate and the pattern surface are parallel to each other as the target relative inclination, before bringing the mold and the imprint material into contact with each other.

10. The imprint apparatus according to claim 1, wherein the controller is configured to determine the inclination angle of the mold, based on a result of measuring an inclination of the surface of the substrate.

11. The imprint apparatus according to claim 1, wherein the controller is configured to bring the mold and the imprint material into contact with each other, while keeping a state where the pattern surface of the mold is inclined against the first direction.

12. An imprint apparatus which forms a pattern of an imprint material on a shot region of a substrate by using a mold including a pattern surface on which a pattern is formed, comprising:
    a driver configured to relatively drive the mold and the substrate to change a relative position and a relative orientation of the mold and the substrate;
    a deformation device configured to deform the pattern surface into a convex shape to bend toward the substrate; and
    a controller configured to arrange the mold and the substrate based on a target relative position set in advance, and bring the mold and the imprint material on the shot region into contact with each other while controlling a deformation of the pattern surface by the deformation device deforms,
    wherein the controller is configured to:
    cause the driver to incline the mold so that the mold and the imprint material start contacting each other from a target position on the shot region,
    estimate a shift amount by which a position on the pattern surface having a pattern to be transferred to the target position shifts from the target position due to the inclining of the mold, based on an inclination angle of the mold, in a second direction perpendicular to a first direction for bringing the mold and the imprint material into contact with each other, and
    cause the driver to bring the mold and the imprint material into contact with each other, after causing the driver to relatively drive the mold and the substrate in the second direction so as to correct for the estimated shift amount.

13. The imprint apparatus according to claim 12, wherein the shot region includes a deficient shot region which is arranged in a peripheral portion of the substrate and to which only part of the pattern of the mold is transferred.

14. The imprint apparatus according to claim 13, wherein the target position includes a barycenter of the deficient shot region.

* * * * *